US012605770B2

(12) United States Patent
Fukui et al.

(10) Patent No.: US 12,605,770 B2
(45) Date of Patent: Apr. 21, 2026

(54) CUTTING TOOL

(71) Applicant: Sumitomo Electric Hardmetal Corp., Itami (JP)

(72) Inventors: Haruyo Fukui, Itami (JP); Daiji Tabayashi, Itami (JP); Momoko Iida, Itami (JP); Taisei Tanaka, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 201 days.

(21) Appl. No.: 18/286,558

(22) PCT Filed: Feb. 9, 2022

(86) PCT No.: PCT/JP2022/005116

§ 371 (c)(1),
(2) Date: Oct. 12, 2023

(87) PCT Pub. No.: WO2022/244342

PCT Pub. Date: Nov. 24, 2022

(65) Prior Publication Data

US 2024/0198431 A1　　Jun. 20, 2024

(30) Foreign Application Priority Data

May 20, 2021　(WO) ................. PCT/JP2021/019172
May 20, 2021　(WO) ................. PCT/JP2021/019173

(51) Int. Cl.
*B32B 27/14*　　　(2006.01)
*B23B 27/14*　　　(2006.01)
(Continued)

(52) U.S. Cl.
CPC ........ *B23B 27/148* (2013.01); *C23C 14/0635* (2013.01); *C23C 14/0641* (2013.01);
(Continued)

(58) Field of Classification Search
CPC .............. B32B 27/148; C23C 14/0635; C23C 14/0641; C23C 14/0664; C23C 14/067;
(Continued)

(56) References Cited

U.S. PATENT DOCUMENTS

2016/0184877 A1　　6/2016　Sobiech et al.
2020/0114431 A1　　4/2020　Koike et al.
(Continued)

FOREIGN PATENT DOCUMENTS

EP　　　　3461928 A1　　4/2019
JP　　H09170068 A　*　6/1997
(Continued)

OTHER PUBLICATIONS

[NPL-1] Suzuki et al. (JP H09-170068 A); Jul. 30, 1997 (JPO machine translation to English). (Year: 1997).*
(Continued)

*Primary Examiner* — Donald M Flores, Jr.
(74) *Attorney, Agent, or Firm* — XSENSUS LLP

(57) ABSTRACT

A cutting tool comprising a base material and a coating disposed on the base material, wherein the coating comprises a first layer, the first layer consists of a $MoC_{1-x}$ layer formed from a compound represented by $MoC_{1-x}$ or a $TaC_{1-y}$ layer formed from a compound represented by $TaC_{1-y}$, the compound represented by $MoC_{1-x}$ consists of a hexagonal crystal structure, the x is 0.40 or more and 0.60 or less, the compound represented by $TaC_{1-y}$ comprises 95% by mass or more of a hexagonal crystal structure, and the y is 0:40 or more and 0.60 or less.

17 Claims, 2 Drawing Sheets

(51) Int. Cl.
   *C23C 14/06*          (2006.01)
   *C23C 14/32*          (2006.01)

(52) U.S. Cl.
   CPC ........ *C23C 14/0664* (2013.01); *C23C 14/067*
          (2013.01); *C23C 14/0676* (2013.01); *C23C*
          *14/325* (2013.01); *B23B 2228/105* (2013.01);
          *Y10T 428/24975* (2015.01)

(58) Field of Classification Search
   CPC ........... C23C 14/0676; B23B 2228/105; Y10T
                                                         428/24975
   See application file for complete search history.

(56)                    References Cited

U.S. PATENT DOCUMENTS

2020/0149157 A1      5/2020   Jo
   2020/0171581 A1      6/2020   Koike et al.

FOREIGN PATENT DOCUMENTS

JP          H11-021651 A      1/1999
   JP          2006-123159 A     5/2006

JP          2010-222186 A     10/2010
   JP          2013-516331 A     5/2013
   JP          2016-530399 A     9/2016
   JP          2018-059146 A     4/2018
   JP          2020-517574 A     6/2020
   JP          2022-008195 A     1/2022
   WO          2011/083457 A1    7/2011
   WO          2019/181740 A1    9/2019
   WO          2019/181742 A1    9/2019

OTHER PUBLICATIONS

Srisattayakul et al., "Reciprocating two-body abrasive wear behavior of DC magnetron sputtered Mo-based coatings on hard chrome plated AISI 316 stainless steel", Wear, 2017, pp. 96-105.
Hisashi Suzuki, "Carbide relationship status diagram", Bulletin of the Japan Institute of Metals, vol. 5, No. 1, 1966, pp. 9-16.
International Search Report and Written Opinion mailed on Mar. 22, 2022, received for PCT Application PCT/JP2022/005116, filed on Feb. 9, 2022, 9 pages including English Translation.
E. Martinez et al., "Tribological performance of TiN supported molybdenum and tantalum carbide coatings in abrasion and sliding contact", Dec. 1, 2002, Wear, vol. 253, pp. 1182-1187, total 6 pages.

* cited by examiner

CUTTING TOOL

CROSS-REFERENCE TO RELATED APPLICATION

The present application is based on PCT filing PCT/JP2022/005116, filed Feb. 9, 2022, which claims priority from PCT filing PCT/JP2021/019172, filed May 20, 2021, and PCT/JP2021/019173, filed May 20, 2021, the entire contents of each are incorporated herein by reference.

TECHNICAL FIELD

The present disclosure relates to a cutting tool.

BACKGROUND ART

Conventionally, various studies have been made for the purpose of prolonging the life of a cutting tool. For example, PTL 1 discloses a cutting tool having a coating comprising a $WC_{1-x}$ layer disposed on a base material.

CITATION LIST

Patent Literature

PTL 1. WO 2019/181742

SUMMARY OF INVENTION

The cutting tool of the present disclosure is a cutting tool comprising a base material and a coating disposed on the base material, wherein the coating comprises a first layer, the first layer consists of a $MoC_{1-x}$ layer formed from a compound represented by $MoC_{1-x}$ or a $TaC_{1-y}$ layer formed from a compound represented by $TaC_{1-y}$, the compound represented by $MoC_{1-x}$ consists of a hexagonal crystal structure, the x is 0.40 or more and 0.60 or less, the compound represented by $TaC_{1-y}$ comprises 95% by mass or more of a hexagonal crystal structure, and the y is 0.40 or more and 0.60 or less.

DETAILED DESCRIPTION

Figure 1:
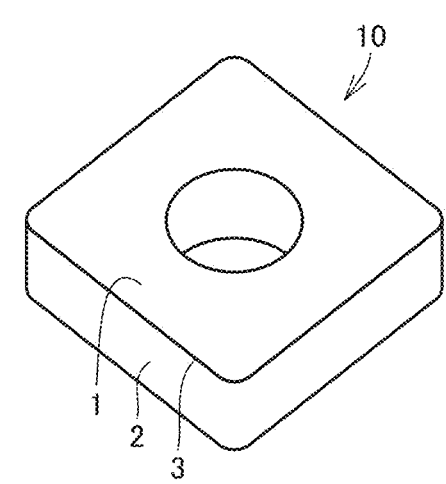
FIG. 1 is a perspective view illustrating one example of a cutting tool.

Problem to be Solved by the Present Disclosure

In recent years, the demand for high-load, high-speed, and high-efficiency working has been more and more increasing, and there is a demand for a cutting tool that can have a long tool life even in high-speed and high-efficiency working.

Advantageous Effect of the Present Disclosure

According to the present disclosure, it is possible to provide a cutting tool having a long tool life even in high-speed and high-efficiency working.

Description of Embodiments

First, embodiments of the present disclosure will be listed and described.

(1) The cutting tool of the present disclosure is a cutting tool comprising a base material and a coating disposed on the base material, wherein the coating comprises a first layer, the first layer consists of a $MoC_{1-x}$ layer formed from a compound represented by $MoC_{1-x}$ or a $TaC_{1-y}$ layer formed from a compound represented by $TaC_{1-y}$, the compound represented by $MoC_{1-x}$ consists of a hexagonal crystal structure, the x is 0.40 or more and 0.60 or less, the compound represented by $TaC_{1-y}$ comprises 95% by mass or more of a hexagonal crystal structure, and the y is 0.40 or more and 0.60 or less.

According to the present disclosure, it is possible to provide a cutting tool having a long tool life even in high-speed and high-efficiency working.

(2) The first layer preferably does not include free carbon. According to this, the breakage resistance and the wear resistance of the cutting tool are improved.

(3) The film hardness of the first layer is preferably 2700 $mgf/\mu m^2$ or more and 4200 $mgf/\mu m^2$ or less. According to this, the breakage resistance and the wear resistance of the cutting tool are improved.

(4) The first layer is preferably in contact with the base material. According to this, the cutting tool can have excellent breakage resistance and wear resistance.

(5) Preferably, the coating further comprises a hard coating layer disposed between the base material and the first layer.

the hard coating layer comprises a first unit layer, a composition of the first unit layer is different from a composition of the first layer, and the first unit layer is formed from at least one element selected from the group consisting of a periodic table group 4 element, a periodic table group 5 element, a periodic table group 6 element, aluminum, and silicon, or formed from a compound consisting of at least one element selected from the group consisting of a periodic table group 4 element, a periodic table group 5 element, a periodic table group 6 element, aluminum, and silicon, and at least one element selected from the group consisting of carbon, nitrogen, oxygen, and boron.

According to this, the breakage resistance and the wear resistance of the cutting tool are improved.

(6) Preferably, the hard coating layer consists of the first unit layer, and a thickness of the first unit layer is 0.1 μm or more and 15 μm or less.

According to this, the breakage resistance and the wear resistance of the cutting tool are improved.

(7) Preferably, the hard coating layer further comprises a second unit layer, a composition of the second unit layer is different from the composition of the first layer and the composition of the first unit layer.

the second unit layer is formed from at least one element selected from the group consisting of a periodic table group 4 element, a periodic table group 5 element, a periodic table group 6 element, aluminum, and silicon, or formed from a compound consisting of at least one element selected from the group consisting of a periodic table group 4 element, a periodic table group 5 element, a periodic table group 6 element, aluminum, and silicon, and at least one element selected from the group consisting of carbon, nitrogen, oxygen, and boron, and the first unit layer and the second unit layer form a multilayer structure in which both the unit layers are alternately laminated, with one or more layers each.

According to this, the breakage resistance and the wear resistance of the cutting tool are improved.

(8) Preferably, a thickness of the first unit layer is 1 nm or more and 100 nm or less, and a thickness of the second unit layer is 1 nm or more and 100 nm or less. According to this, the breakage resistance and the wear resistance of the cutting tool are improved.

(9) Preferably, a thickness of the first layer is 0.1 $\mu$m or more and 10 $\mu$m or less, and a thickness of the hard coating layer is 0.1 $\mu$m or more and 10 $\mu$m or less.

According to this, the breakage resistance and the wear resistance of the cutting tool are improved.

(10) A thickness of the coating is preferably 0.2 $\mu$m or more and 20 $\mu$m or less. According to this, the breakage resistance and the wear resistance of the cutting tool are improved.

(11) The base material preferably includes at least one selected from the group consisting of a cemented carbide, a cermet, high-speed steel, a ceramic, a cubic boron nitride sintered material, and a diamond sintered material. According to this, the cutting tool can have excellent hardness and strength even at a high temperature.

Details of the Embodiments of the Present Disclosure

With reference to the drawings, specific examples of the cutting tool according to the present disclosure will be described below. In the drawings of the present disclosure, the same reference signs represent the same portions or equivalent portions. A dimensional relationship such as length, width, thickness, or depth is appropriately changed for clarity and simplification of the drawings, and does not necessarily represent an actual dimensional relationship.

As used herein, the expression of a range in the format "A to B" means the upper limit and the lower limit of the range (that is, A or more and B or less), and when no unit is written with A and a unit is only written with B, the unit for A and the unit for B are the same As used herein, when a compound or the like is represented by a chemical formula without a particular atomic ratio, the chemical formula shall include all conventionally known atomic ratios, and should not necessarily be limited only to those within the stoichiometric range. For example, when "TiAlN" is provided, the ratio of the numbers of atoms constituting TiAlN includes all conventionally known atomic ratios.

Embodiment 1: Cutting Tool

The cutting tool of the present disclosure (hereinafter also referred to as Embodiment 1 or the present embodiment) is a cutting tool comprising a base material and a coating disposed on the base material, wherein the coating comprises a first layer, the first layer consists of a $MoC_{1-x}$ layer formed from a compound represented by $MoC_{1-x}$ or a $TaC_{1-y}$ layer formed from a compound represented by $TaC_{1-y}$, the compound represented by $MoC_{1-x}$ consists of a hexagonal crystal structure, the x is 0.40 or more and 0.60 or less, the compound represented by $TaC_{1-y}$ comprises 95% by mass or more of a hexagonal crystal structure, and the y is 0.40 or more and 0.60 or less.

The cutting tool of the present embodiment (hereinafter sometimes simply referred to as the "cutting tool") includes a base material and a coating disposed on the base material. Examples of the cutting tool include a drill, an end mill, an indexable cutting insert for a drill, an indexable cutting insert for an end mill, an indexable cutting insert for milling working, an indexable cutting insert for turning working, a metal saw, a gear cutting tool, a reamer, and a tap.

FIG. 1 is a perspective view illustrating one example of a cutting tool. A cutting tool having such a shape is used, for example, as an indexable cutting insert. A cutting tool 10 has a rake face 1, a flank face 2, and a cutting edge ridgeline portion 3, where rake face 1 and flank face 2 intersect. That is, rake face 1 and flank face 2 are faces connected with cutting edge ridgeline portion 3 interposed therebetween. Cutting edge ridgeline portion 3 constitutes a cutting edge tip portion of cutting tool 10. Such a shape of cutting tool 10 can also be regarded as the shape of the base material of the cutting tool. That is, the base material has a rake face, a flank face, and a cutting edge ridgeline portion connecting the rake face and the flank face.

Base Material

As the base material of the present embodiment, any base material can be used as long as it is conventionally known as a base material of this type. For example, the base material preferably includes at least one selected from the group consisting of a cemented carbide (for example, a tungsten carbide (WC)-base cemented carbide, a WC-Co based cemented carbide, a WC-TaC—Co based cemented carbide, and also a cemented carbide to which a carbonitride of Cr, Ti, Ta, Nb, or the like has been added), a cermet (one including TiC, TiN, TiCN, or the like as a main component), high-speed steel, a ceramic (such as titanium carbide, silicon carbide, silicon nitride, aluminum nitride, or aluminum oxide), a cubic boron nitride sintered material (cBN sintered material), and a diamond sintered material, and more preferably includes at least one selected from the group consisting of a cemented carbide, a cermet, and a cBN sintered material.

When a cemented carbide is used as the base material, the effect of the present embodiment is exhibited even if such a cemented carbide includes free carbon or an abnormal phase referred to as an n phase in the structure. The base material used in the present embodiment may have a modified surface. For example, in the case of a cemented carbide, a β-free layer may be formed on the surface thereof, and in the case of a cermet, a surface-hardened layer may be formed, even if the surface is modified as described above, the effect of the present embodiment is exhibited.

When the cutting tool is an indexable cutting insert (such as an indexable cutting insert for milling working), the base material includes one having a chip breaker and one having no chip breaker. The shape of the ridgeline portion of the cutting edge includes any shape of a sharp edge (a ridge where a rake face and a flank face intersect), a honing (a shape obtained by rounding a sharp edge), a negative land (a chamfered shape), and a shape obtained by combining a boning and a negative land.

Coating

The "coating" according to the present embodiment has a function to improve various properties of the cutting tool, such as breakage resistance and wear resistance, by covering at least a part of the surface of the base material. Here, "at least a part of the surface of the base material" includes a portion that comes into contact with a work material during cutting working. The portion that comes into contact with a work material can be, for example, a region within 2 mm from the cutting edge ridgeline on the surface of the base material. Even if a part of the base material is not covered with the coating or if the configuration of the coating is partially different, this does not depart from the scope of the present embodiment.

Figure 2:
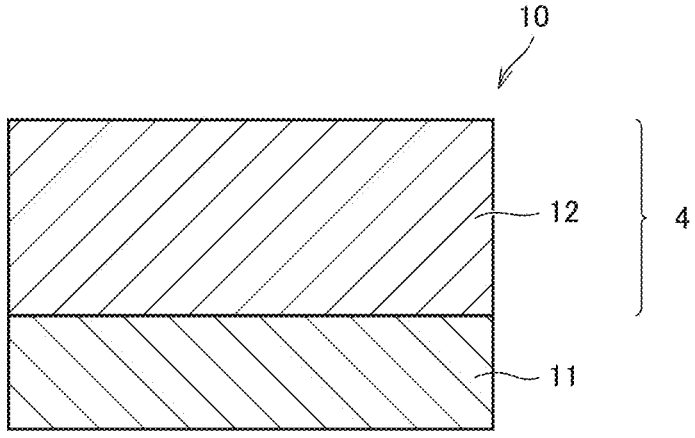
FIG. 2 is a schematic cross-sectional view of a cutting tool in one example of the present embodiment.
Figure 3:
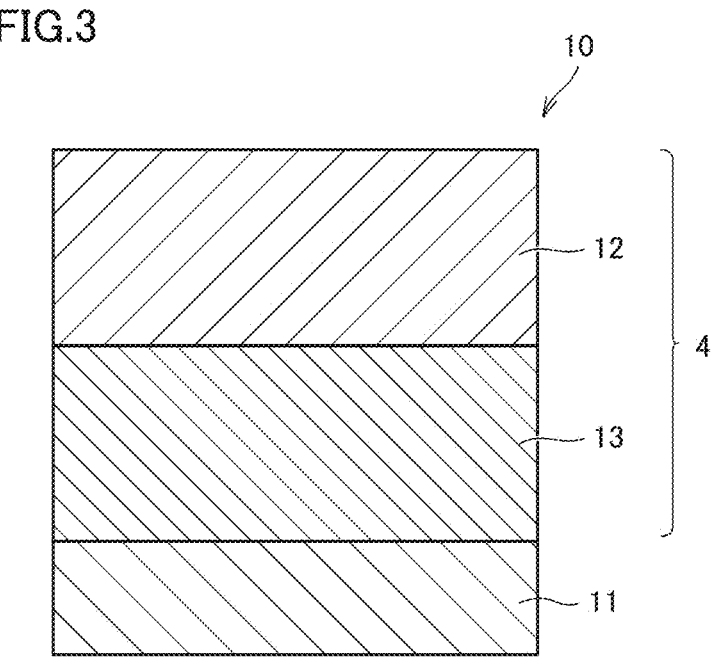
FIG. 3 is a schematic cross-sectional view of a cutting tool in another example of the present embodiment.
Figure 4:
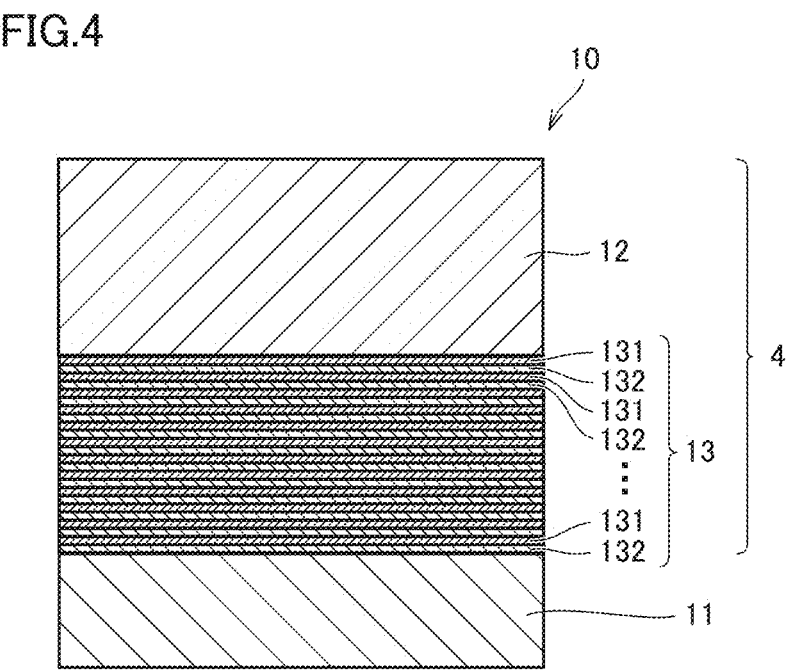
FIG. 4 is a schematic cross-sectional view of a cutting tool in still another example of the present embodiment.

As shown in FIG. 2, a coating 4 can consist of a first layer 12. As shown in FIG. 3 and FIG. 4, a coating 4 can include a first layer 12 and a hard coating layer 13 disposed between a first layer 12 and a base material 11. The coating 4 can include a different layer in addition to a first layer 12. Examples of the different layer include a base layer (not shown) disposed between the hard coating layer and the base material, an intermediate layer (not shown) disposed between the first layer and the hard coating layer, and a surface layer (not shown) disposed on the first layer.

The thickness of the costing is preferably 0.1 μm or more and 20 μm or less, preferably 0.1 μm or more and 10 μm or less, preferably 0.2 μm or more and 20 μm or less, preferably 0.2 μm or more and 10 μm or less, more preferably 0.3 μm or more and 10 μm or less, further preferably 0.5 μm or more and 10 μm or less, further more preferably 1 μm or more and 6 μm or less, and particularly preferably 1.5 μm or more and 4 μm or less. When the thickness is 0.1 μm or more, the wear resistance of the cutting tool is improved. When the thickness is 0.2 μm or more, the wear resistance of the cutting tool is further improved. When the thickness is 20 μm or less, it is easy to suppress peeling or destruction of the coating when a large stress is applied between the coating and the base material in interrupted working. Here, the term "thickness of the coating" means the total sum of the thicknesses of the layers constituting the coating such as the $MoC_{1-x}$ layer, the $TaC_{1-y}$ layer, the hard coating layer, and the base layer. The thickness of the coating is determined by measuring thicknesses of a sample at arbitrary three points in a cross-section parallel to the normal direction of the surface of the base material by using a transmission electron microscope (TEM) and taking the average value of the thicknesses at the three measured points. The same also applies when measuring the thickness of each of the $MoC_{1-x}$ layer, the $TaC_{1-y}$ layer, the hard coating layer (first unit layer and second unit layer), and the base layer, which will be described later. Examples of the transmission electron microscope include JEM-2100F (trademark), a spherical aberration corrector manufactured by JEOL Ltd.

It has been confirmed that even if the measurement is carried out a plurality of times by changing the location of the measurement region selected, there is little variation in the measurement results, as long as the measurement is carried out on the same sample, and that even if the measurement region is arbitrarily set, it will not be contrived.

First Layer

In the present embodiment, the coating comprises a first layer, and the first layer consists of a $MoC_{1-x}$ layer formed from a compound represented by $MoC_{1-x}$ or a $TaC_{1-y}$ layer formed from a compound represented by $TaC_{1-y}$.

<$MoC_{1-x}$ Layer>

In the present embodiment, the $MoC_{1-x}$ layer is formed from a compound represented by $MoC_{1-x}$. The term "compound represented by $MoC_{1-x}$" (hereinafter sometimes referred to as "$MoC_{1-x}$") means molybdenum carbide having an element ratio of the carbon element (C) of 1-x when the element ratio of the molybdenum element (Mo) is 1. The $MoC_{1-x}$ layer may include an unavoidable impurity as long as it does not impair the effect exhibited by the cutting tool according to the present embodiment. Examples of the unavoidable impurity include hydrogen, oxygen, nitrogen, and argon. The proportion of the unavoidable impurity contained is preferably 0% by mass or more and 0.2% by mass or less based on the total mass of the $MoC_{1-x}$ layer. Similarly, the "hard coating layer" and "different layer" described later may also include an unavoidable impurity as long as it does not impair the effect exhibited by the cutting tool according to the present embodiment.

The x is 0.40 or more and 0.60 or less, preferably 0.45 or more and 0.55 or less, and more preferably 0.50 or more and 0 SS or less. When the x is less than 0.40, free carbon tends to precipitate at a crystal grain boundary of $MoC_{1-x}$ to reduce the strength. When the x exceeds 0.60, the strength of the crystal grain boundary tends to decrease. Because of these, when x is outside the range of 0.40 or more and 0.60 or less, crack propagation tends to be unable to be suppressed to reduce the toughness. The present inventors presume that such tendencies are caused by an inappropriate balance between crystal homogeneity and strain.

The x can be determined by obtaining a cross-sectional sample parallel to the normal direction of the surface of the base material in the $MoC_{1-x}$ layer and analyzing a crystal grain appearing in this cross-sectional sample by using an energy dispersive X-ray spectroscopy (EDX) apparatus attached to a scanning electron microscope (SEM) or TEM. Specifically, the value of the x is determined by measuring a value of the x at each of arbitrary three points in the $MoC_{1-x}$ layer of the cross-sectional sample, and the average value of the values at the three points determined is defined as x in the $MoC_{1-x}$ layer of the cross-sectional sample. Here, as the "arbitrary three points," three arbitrary 30 nm×30 nm regions in the $MoC_{1-x}$ layer are selected. Examples of the EDX apparatus include JED-2200 (trademark), a silicon drift detector manufactured by JEOL Ltd. The measurement conditions are as follows Measurement Conditions of EDX Method Acceleration voltage: 200 kV Probe current: 0.29 nA Probe size: 0.2 nm It has been confirmed that even if the measurement is carried out a plurality of times by changing the location of the measurement region selected, there is little variation in the measurement results, as long as the measurement is carried out on the same sample, and that even if the measurement region is arbitrarily set, it will not be contrived.

The compound represented by $MoC_{1-x}$ consists of a hexagonal crystal structure. Here, the expression "the compound represented by $MoC_{1-x}$ consists of a hexagonal crystal structure" means that the percentage of the hexagonal crystal structure in the compound represented by $MoC_{1-x}$ is 100% by mass and that no crystal structure of a different crystal type is included. For example, by carrying out X-ray diffraction measurement (XRD measurement) at arbitrary three points in the $MoC_{1-x}$ layer followed by analysis, it is confirmed that the compound represented by $MoC_{1-x}$ consists of a hexagonal crystal structure. When the compound represented by $MoC_{1-x}$ consists of a hexagonal crystal structure, peaks assigned to hexagonal crystal planes such as the (100) plane, the (002) plane, the (101) plane, the (102) plane, the (110) plane, the (103) plane, the (112) plane, and the (201) plane are found, and no peak assigned to a crystal plane of a crystal system other than the hexagonal system is found, in all three measurement points in the XRD measurement. Examples of the apparatus used for the X-ray diffraction measurement include "SmartLab" (trade name) manufactured by Rigaku Corporation and "X' Pert" (trade name) manufactured by Panalytical. The measurement conditions are as follows.

Measurement Conditions of XRD Method

Scan axis: $2\theta$-$\theta$

X-ray source: Cu—K$\alpha$ radiation (1.541862 A)

Detector: Zero-dimensional detector (scintillation counter)

Tube voltage: 45 kV

Tube current: 40 mA

Incidence optical system: use of a mirror

Receiving optical system: use of an analyzer crystal (PW3098/27)

Step: 0.03°

Integration time: 2 seconds

Scan range ($2\theta$): 10° to 120°

It has been confirmed that even if the measurement is carried out a plurality of times by changing the location of the measurement point selected, there is little variation in the measurement results, as long as the measurement is carried out on the same sample, and that even if the measurement point is arbitrarily set, it will not be contrived.

$TaC_{1-y}$ Layer

In the present embodiment, the $TaC_{1-y}$ layer is formed from a compound represented by $TaC_{1-y}$. The term "compound represented by $TaC_{1-y}$" (hereinafter sometimes referred to as "$TaC_{1-y}$") means tantalum carbide having an element ratio of the carbon element (C) of 1-y when the element ratio of the tantalum element (Ta) is 1. The $TaC_{1-y}$ layer may include an unavoidable impurity as long as it does not impair the effect exhibited by the cutting tool according to the present embodiment. Examples of the unavoidable impurity include hydrogen, oxygen, nitrogen, and argon. The proportion of the unavoidable impurity contained is preferably 0% by mass or more and 0.2% by mass or less based on the total mass of the $TaC_{1-y}$ layer.

The y is 0.40 or more and 0.60 or less, preferably 0.45 or more and 0.55 or less, and more preferably 0.50 or more and 0.55 or less. When the y is less than 0.40, free carbon tends to precipitate at a crystal grain boundary of $TaC_{1-y}$ to reduce the strength. When the y exceeds 0.6, the strength of the crystal grain boundary tends to decrease. Because of these, when y is outside the above range, crack propagation tends to be unable to be suppressed to reduce the toughness. The present inventors presume that such tendencies are caused by an inappropriate balance between crystal homogeneity and strain.

The y is measured by EDX attached to SEM or TEM in the same manner as in the method for measuring x in the $MoC_{1-x}$ layer. The specific measurement method and measurement conditions are the same as the measurement method and measurement conditions for the x in the $MoC_{1-x}$ layer.

It has been confirmed that even if the measurement is carried out a plurality of times by changing the location of the measurement region selected, there is little variation in the measurement results as long as the measurement is carried out on the same sample, and that even if the measurement region is arbitrarily set, it will not be contrived.

The compound represented by $TaC_{1-y}$ includes 95% by mass or more of a hexagonal crystal structure. The content of the hexagonal crystal structure in the compound represented by $TaC_{1-y}$ is preferably 96% by mass or more, more preferably 98% by mass or more, and further preferably 100% by mass. It is confirmed by the following method that the compound represented by $TaC_{1-y}$ includes 95% by mass or more of a hexagonal crystal structure. XRD measurement is carried out on arbitrary one point of the $TaC_{1-y}$ layer, and when n peaks assigned to hexagonal crystal planes (typically, (100) plane, (002) plane, (101) plane, (110) plane, (102) plane, (103) plane, (112) plane, (201) plane, and the like) are found, the peak intensity Ii (i=1, 2, . . . , n) and the half width Wi (i=1, 2, . . . , n) are determined for each peak, and the peak area $\Sigma Si$ (Ii×Wi) (i=1, 2, . . . , n) is determined. The peak area ESi is defined as the amount (% by mass) of the hexagonal crystal structure in the compound represented by $TaC_{1-y}$.

When peaks assigned to cubic crystal planes (typically, (100) plane, (111) plane, (200) plane, (220) plane, (311) plane, and the like) are found at the same measurement point as above, the peak area $\Sigma S'i$ (I'i×W'i) (i=1, 2, . . . , n) is determined in the same manner as above. The peak area $\Sigma S'i$ is defined as the amount (% by mass) of the cubic crystal structure in the compound represented by $TaC_{1-y}$.

The percentage of the amount of the hexagonal crystal structure, $\Sigma Si$, to the sum of the amount of the hexagonal crystal structure. $\Sigma Si$, and the amount of the cubic crystal structure, $\Sigma S'i$, $(\Sigma Si/(\Sigma Si+\Sigma S'i)/100)$ is calculated. The XRD measurement is carried out at arbitrary three points in the $TaC_{1-y}$ layer, and the average value of $(\Sigma Si/(\Sigma Si+\Sigma S'i)\times100)$ of the three points is calculated. The average value is defined as the content (% by mass) of the hexagonal crystal structure in the compound represented by $TaC_{1-y}$.

When the compound represented by $TaC_{1-y}$ consists only of a hexagonal crystal structure, peaks assigned to hexagonal crystal planes such as the (100) plane, the (002) plane, the (101) plane, the (110) plane, the (102) plane, the (103) plane, the (112) plane, and the (201) plane are found, and no peak assigned to a crystal plane of a crystal system other than the hexagonal system is found, in all three measurement points in the XRD measurement. The apparatus and the measurement conditions used for the X-ray diffraction measurement are the same as in the method for confirming the crystal structure of the compound represented by $MoC_{1-x}$ described above.

It has been confirmed that even if the measurement is carried out a plurality of times by changing the location of the measurement point selected, there is little variation in the measurement results as long as the measurement is carried out on the same sample, and that even if the measurement point is arbitrarily set, it will not be contrived.

FIG. 2 is a schematic cross-sectional view of a cutting tool in one example of the present embodiment. As shown in FIG. 2, the first layer 12 is preferably in contact with the base material 11. In other words, the first layer 12 is preferably provided directly on the base material 11.

In the cemented carbide of the present embodiment, the first layer preferably does not include free carbon. Here, the expression "the first layer does not include free carbon" encompasses both the mean that the first layer does not include free carbon at all and the mean that the amount of free carbon in the first layer is below the detection limit. The term "free carbon" means carbon that is present as a simple substance and is not a constituent element of the first layer. Examples of the free carbon include a simple substance of carbon including a carbon-carbon double bond such as graphite or soot. The presence or absence of free carbon is confirmed by investigating the presence of absence of a carbon-carbon double bond (the presence or absence of a C=C peak in XPS Cls) at arbitrary three points on the surface of the first layer by using X-ray photoelectron spectroscopy (XPS method). When a carbon-carbon double bond is present at one or more of the arbitrary three points, it is determined that the first layer includes free carbon. When no carbon-carbon double bond is present at all of the arbitrary three points, it is determined that the first layer does not include free carbon. Here, when the first layer is provided as the outermost surface of the coating, any native oxide layer is removed by $Ar^+$ sputtering or the like, and then the above measurement of the presence of absence of free carbon is carried out. When the first layer is not the outermost surface, the first layer is exposed by $Ar^+$ sputtering or the like, and then the above measurement of the presence or absence of free carbon is carried out. Examples of an apparatus used for the XPS method include Versa Probe III (trade name) manufactured by ULVAC-PHI, Inc. The measurement conditions are as follows.

Measurement Conditions of XPS Method

X-ray source used: mono-AlKα radiation (hv=1486.6 eV)

Detection depth: 1 nm to 10 nm

X-ray beam diameter: About 100 μmφ

Neutralization gun: Dual type used $Ar^+$: Acceleration voltage of 4 kV

Raster size. 1×1 mm

Sputtering speed ($Ar^+$): Value in terms of $SiO_2$ sputtering of 28.3 nm/min

It has been confirmed that even if the measurement is carried out a plurality of times by changing the location of the measurement point selected, there is little variation in the measurement results, as long as the measurement is carried out on the same sample, and that even if the measurement point is arbitrarily set, it will not be contrived.

The film hardness of the first layer is preferably 2700 mgf/μm² or more and 4200 mgf/μm² or less, more preferably 2700 mgf/μm² or more and 4100 mgf/μm² or less, and more preferably 2800 mgf/μm² or more and 4000 mgf/μm² or less. The film hardness is measured with a nanoindenter. Specifically, first, the film hardness is measured at each of arbitrary 10 points on the surface of the first layer. After that, the average value of the film hardness of the 10 points determined is defined as the film hardness of the first layer of the above cross-sectional sample. Here, when the first layer is not the outermost surface, the first layer is exposed by mechanical polishing or the like, and then the measurement is carried out with the nanoindenter. Examples of the nanoindenter include ENT1100 (trade name) manufactured by ELIONIX INC. The measurement conditions are as follows.

Measurement Conditions of Nanoindenter

Indenter: Berkovich

Load: 1 gf

Loading time: 10 sec

Holding time 2 sec

Unloading time: 10 sec

It has been confirmed that even if the measurement is carried out a plurality of times by changing the location of the measurement point selected, there is little variation in the measurement results, as long as the measurement is carried out on the same sample, and that even if the measurement point is arbitrarily set, it will not be contrived.

The thickness of the first layer is preferably 0.1 μm or more and 10.0 μm or less, preferably 0.1 μm or more and 7 μm or less, and more preferably 0.5 μm or more and 3 μm or less.

Hard Coating Layer

The coating preferably further includes a hard coating layer disposed between the base material and the first layer. The hard coating layer preferably includes a first unit layer. The composition of the first unit layer is preferably different from the composition of the first layer. Here, the expression "disposed between the base material and the first layer" means that as long as the hard coating layer may be disposed between the base material and the first layer, the hard coating layer does not need to be in contact with the base material and the first layer. A different layer may be disposed between the base material and the hard coating layer, or a different layer may be disposed between the hard coating layer and the first layer.

First Unit Layer

The first unit layer is preferably formed from at least one element selected from the group consisting of a periodic table group 4 element, a periodic table group 5 element, a periodic table group 6 element, aluminum, and silicon, or formed from a compound consisting of at least one element selected from the group consisting of a periodic table group 4 element, a periodic table group 5 element, a periodic table group 6 element, aluminum, and silicon, and at least one element selected from the group consisting of carbon, nitrogen, oxygen, and boron. The first unit layer is more preferably formed from at least one element selected from the group consisting of chromium, aluminum, titanium, and silicon, or a compound consisting of at least one element selected from the group consisting of chromium, aluminum, titanium, and silicon, and at least one element selected from the group consisting of carbon, nitrogen, oxygen, and boron. Examples of the periodic table group 4 element include titanium (Ti), zirconium (Zr) and hafnium (Hf) Examples of the periodic table group 5 element include vanadium (V), niobium (No), and tantalum (Ta). Examples of the periodic table group 6 element include chromium (Cr), molybdenum (Mo), and tungsten (W).

Examples of the compound included in the first unit layer include TiAlN, TiAlSiCN, TiAlSiON, TiAlBCN, TiAlSiN, TiCrSiN, TiAlCrSiN, AlCrN, AlCrO, AlCrSiN, TiZrN, TiAlMoN, TiAlNbN, TiSiN, AlCrTaN, AlTiVN, $TiB_2$, TrCrHfN, CrSiWN, TiAlCN, TiSiCN, AlZrON, AlCrCN, AlHfN, CrSiBON, CrAlBN, TiAlWN, AlCrMoCN, TiAlBN, TiAlCrSiBCNO, ZrN, $ZrB_2$, ZrCN, CrSiBN, AlCrBN, and AlCrBON.

When the hard coating layer consists only of the first unit layer (for example, in the case of FIG. 3), the thickness of the first unit layer (that is, the hard coating layer) is preferably 0.1 μm or more and 15 μm or less, more preferably 0.1 μm or more and 10 μm or less, and further preferably 0.5 μm or more and 7 μm or less.

Second Unit Layer

The hard coating layer preferably further includes a second unit layer. The composition of the second unit layer is preferably different from the composition of the first layer and the composition of the first unit layer. The second unit layer is preferably formed from at least one element selected from the group consisting of a periodic table group 4 element, a periodic table group 5 element, a periodic table group 6 element, aluminum, and silicon, or formed from a compound consisting of at least one element selected from the group consisting of a periodic table group 4 element, a periodic table group 5 element, a periodic table group 6 element, aluminum, and silicon, and at least one element selected from the group consisting of carbon, nitrogen, oxygen, and boron. The second unit layer is more preferably formed from at least one element selected from the group consisting of chromium, aluminum, titanium, and silicon, or a compound consisting of at least one element selected from the group consisting of chromium, aluminum, titanium, and silicon, and at least one element selected from the group consisting of carbon, nitrogen, oxygen, and boron. Specific examples of each of the periodic table group 4 element, the periodic table group 5 element, and the periodic table group 6 element include the elements described above.

Examples of the compound included in the second unit layer include the above compounds given as examples of the compound included in the first unit layer.

The first unit layer and the second unit layer preferably form a multilayer structure in which both the unit layers are alternately laminated, with one or more layers each. That is, as shown in FIG. 4, hard coating layer 13 preferably includes a multilayer structure consisting of a first unit layer 131 and a second unit layer 132. Here, the lamination for the multilayer structure may be started from either layer of the first unit layer or the second unit layer. That is, the interface on the first layer side in the multilayer structure may be constituted by either of the first unit layer or the second unit layer. Also, the interface on the side opposite to the first layer side in the multilayer structure may be constituted by either of the first unit layer or the second unit layer.

When the hard coating layer includes a multilayer structure, the thickness of the hard coating layer is preferably 0.1 μm or more and 10 μm or less, and more preferably 0.5 μm or more and 7 μm or less. When the hard coating layer includes a multilayer structure, preferably the thickness of the first layer is 0.1 μm or more and 10 μm or less, and the thickness of the hard coating layer is 0.1 μm or more and 10 μm or less. According to this, the breakage resistance and the wear resistance of the cutting tool are improved.

When the hard coating layer includes a multilayer structure, the thickness of the first unit layer is preferably 1 nm or more and 100 nm or less, and preferably 1 nm or more and 50 nm or less, and more preferably 2 nm or more and 25 μm or less. Further, the thickness of the second unit layer is preferably 1 nm or more and 100 nm or less, and preferably 1 nm or more and 60 nm or less, and more preferably 2 nm or more and 25 nm or less. In one example of the present embodiment, when the hard coating layer includes a multilayer structure, preferably the thickness of the first unit layer is 1 nm or more and 100 nm or less, and the thickness of the second unit layer is 1 nm or more and 100 nm or less. Here, the term "thickness of the first unit layer" means the thickness per layer of the first unit layer. The term "thickness of the second unit layer" means the thickness per layer of the second unit layer.

As for the number of laminated layers in the multilayer structure, one layer each of the first unit layer and the second unit layer may be laminated, and preferably 20 to 2500 layers each of both the unit layers can be laminated, as long as the thickness of the entire hard coating layer is within the above range Different Layer The coating may further include a different layer, in addition to the first layer and the hard coating layer, as long as it does not impair the effect of the present embodiment. The composition of the different layer may be different from or the same as that of the first layer and that of the hard coating layer. The position of the different layer in the coating is also not particularly limited. Examples of the different layer include a base layer provided between the base material and the first layer, an intermediate layer provided between the first layer and the hard coating layer, and a surface layer provided on the first layer. Examples of the different layer include a TiN layer, a TiWCN layer, a TiCN layer, a $ZrB_2$ layer, a TiSiN layer, and an AlCrN layer.

The thickness of the different layer is not particularly limited as long as it does not impair the effect of the present embodiment. Examples of the thickness thereof include 0.002 μm or more and 10 μm or less. The thickness of the different layer can be 0.003 μm or more and 1 μm or less, 0.003 μm or more and 0.01 μm or less, 0.5 μm or more and 10 μm or less, or 0.5 μm or more and 5 μm or less.

Embodiment 2: Method for Manufacturing Cutting Tool

The method for manufacturing the cutting tool according to the present embodiment includes a base material provision step and a first layer coating step. Hereinafter, each step will be described.

Base Material Provision Step

In the base material provision step, the base material is provided. As the base material, any base material can be used as long as it is conventionally known as a base material of this type, as described above. For example, when the base material is formed from a cemented carbide, first, raw material powders according to a predetermined blending formulation (% by mass) are uniformly mixed by using a commercially available attritor. Subsequently, the resulting mixed powder is pressure-molded into a predetermined shape (for example, SEET13T3AGSN or CNMG120408N-EG). After that, by sintering the pressure-molded mixed powder for 1 to 2 hours in a predetermined sintering furnace at 1300 to 1500° C. or less, the base material formed from the cemented carbide can be obtained. Alternatively, as the base material, a commercially available product may be used as it is. Examples of the commercially available product include EH520 (trademark) manufactured by Sumitomo Electric Hardmetal Corp.

First Layer Coating Step

In the first layer coating step, at least a part of the surface of the base material is coated with the first layer to obtain a cutting tool. Here, "at least a part of the surface of the base material" includes a portion that comes into contact with a work material during cutting working. The portion that comes into contact with a work material can be, for example, a region within 2 mm from the cutting edge ridgeline on the surface of the base material.

The method for coating at least a part of the base material with the first layer is not particularly limited. Examples of the method include forming the first layer by a physical vapor deposition method (PVD method).

As the physical vapor deposition method, a conventionally known physical vapor deposition method can be used without particular limitation. Examples of such a physical vapor deposition method include a sputtering method, an ion plating method, an arc ion plating method, and an electron ion beam vapor deposition method. In particular, when a cathodic arc ion plating method or a sputtering method, which gives a high ionization rate of a raw material element is used, a metal bombardment treatment and/or a gas ion bombardment treatment can be carried out on the base material surface before forming a coating and thus the close adhesion between the coating and the base material is remarkably improved. Therefore such a method is preferable.

Formation of $MoC_{1-x}$ Layer

Mo has a high melting point and is difficult to melt. Therefore, a stable discharge was unable to be maintained in a physical vapor deposition method, and a MoC layer formed from hexagonal MoC and having good film quality was thus unable to be formed. The present inventors have carried out intensive studies and as a result have found a method that can stably prepare a $MoC_{1-x}$ layer formed from hexagonal $MoC_{1-x}$ and having good film quality. As one example of the method, the case of forming a $MoC_{1-x}$ layer $(0.40 \le x \le 0.60)$ consisting of a hexagonal crystal structure by an are ion plating method will be described below.

First, a MoC target is set in an arc-type evaporation source in an apparatus, the substrate (base material) temperature is set to 450 to 600° C., and the apparatus is evacuated. Subsequently, for example, one or both of argon gas and krypton gas is/are introduced to set the gas pressure in the apparatus to 1.0 to 3.0 Pa. Then, a negative bias voltage of 200 to 1000 V is applied to the substrate via a DC power supply to clean the surface of the base material for 40 minutes After that, an arc current of 80 to 200 A is supplied to the cathode electrode to generate a metal ion and the like from the arc-type evaporation source, whereby a hexagonal $MoC_{1-x}$ layer $(0.40 \le x \le 0.60)$ can be formed. At this time, at the beginning of the formation of the $MoC_{1-x}$ layer (the film thickness is in the range of 0.1 μm or less), the base material temperature and the substrate bias are set to 400 to 450° C. and −50 V, respectively, and toward the end of the formation, the temperature and the substrate bias are gradually raised to 450° C. to 550° C., and −60 to −75 V, respectively. Examples of the apparatus used for the arc ion plating method include AIP (trade name) manufactured by Kobe Steel, Ltd.

Formation of $TaC_{1-y}$ Layer

Ta has a high melting point and is difficult to melt. Therefore, a stable discharge was unable to be maintained in a physical vapor deposition method, and a TAC layer including cubic TaC and having good film quality was thus unable to be formed. The present inventors have carried out intensive studies and as a result have found a method that can stably prepare a $TaC_{1-y}$ layer including hexagonal $TaC_{1-y}$ and having good film quality. As one example of the method, the case of forming a $TaC_{1-y}$ layer $(0.40 \le y \le 0.60)$ including 95% by mass or more of a hexagonal crystal structure by an are ion plating method will be described below.

First, a TaC target is set in an arc-type evaporation source in the apparatus, the substrate (base material) temperature is set to 450 to 600° C., and the apparatus is evacuated. Subsequently, for example, one or both of argon gas and krypton gas is/are introduced to set the gas pressure in the apparatus to 1.0 to 3.0 Pa. Then, a negative bias voltage of 200 to 1000 V is applied to the substrate via a DC power supply to clean the surface of the base material for 40 minutes. After that, an arc current of 80 to 200 A is supplied to the cathode electrode to generate a metal ion and the like from the arc-type evaporation source, whereby a $TaC_{1-y}$ layer $(0.40 \le y \le 0.60)$ including 95% by mass or more of a hexagonal crystal structure can be formed. At this time, at the beginning of the formation of the $TaC_{1-y}$ layer (the film thickness is in the range of 0.1 μm or less), the base material temperature and the substrate bias are set to 400 to 450° C. and −50 V, respectively, and toward the end of the formation, the temperature and the substrate bias are gradually raised to 450° C. to 550° C., and −60 to −75 V, respectively. Examples of the apparatus used for the arc ion plating method include AIP (trade name) manufactured by Kobe Steel, Ltd.

Hard Coating Layer Coating Step

The method for manufacturing the cutting tool according to the present embodiment preferably further includes a step of coating with a hard coating layer before the first layer coating step. The method for forming a hard coating layer is not particularly limited, and a conventional method can be used. Specific examples of the method include forming the hard coating layer by the PVD method described above.

Other Steps

The manufacturing method according to the present embodiment can include, in addition to the steps described above, a base layer coating step of forming a base layer between the base material and the first layer, an intermediate layer coating step of forming an intermediate layer between the first layer and the hard coating layer, and a surface layer coating step of forming a surface layer on the first layer. When a different layer such as the base layer, the intermediate layer, and the surface layer described above is formed, the different layer may be formed by a conventional method. Specific examples of the method include forming the different layer by the PVD method described above.

Further, the manufacturing method according to the present embodiment can appropriately include a step of carrying out a metal bombardment treatment, carrying out a peening treatment, and carrying out a surface treatment. Examples of the metal bombardment treatment include a method including subjecting Ti to cathode evaporation in an argon gas atmosphere and mixing the argon gas on the base material surface to form a mixing layer. Examples of the surface treatment include polishing with an abrasive grain and brush polishing. More specific examples include a method involving using a medium having a diamond powder supported on an elastic material.

Examples of an apparatus for carrying out the surface treatment include SIRIUS Z manufactured by Fuji Manufacturing Co., Ltd.

Supplementary Note 1

The cutting tool of the present disclosure comprises a base material and a coating disposed on the base material, wherein the coating comprises a $MoC_{1-x}$ layer formed from a compound represented by $MoC_{1-x}$, the x is 0.40 or more and 0.60 or less, and the compound represented by $MoC_{1-x}$ consists of a hexagonal crystal structure.

Supplementary Note 2

The $MoC_{1-x}$ layer preferably does not include free carbon.

Supplementary Note 3

The film hardness of the $MoC_{1-x}$ layer is preferably 2700 mgf/μm² or more and 4200 mgf/μm² or less.

Supplementary Note 4

The $MoC_{1-x}$ layer is preferably in contact with the base material.

Supplementary Note 5

The cutting tool of the present disclosure comprises a base material and a coating disposed on the base material, wherein the coating comprises a $TaC_{1-y}$ layer formed from a compound represented by $TaC_{1-y}$ the y is 0.40 or more and 0.60 or less, and the compound represented by $TaC_{1-y}$ comprises 95% by mass or more of a hexagonal crystal structure.

Supplementary Note 6

The $TaC_{1-y}$ layer preferably does not include free carbon.

Supplementary Note 7

The film hardness of the $TaC_{1-y}$ layer is preferably 2700 mgf/$\mu m^2$ or more and 4200 mgl/$\mu m^2$ or less.

Supplementary Note 8

The $TaC_{1-y}$ layer is preferably in contact with the base material.

EXAMPLES

The present embodiments will be described more specifically by way of Examples. However, the present embodiments are not limited by these Examples.

Example 1

Preparation of Cutting Tool

Sample 1 to Sample 26

Base Material Provision Step

As a base material, JIS standard K10 cemented carbide (shape: JIS standard SEET13T3AGSN-L and CNMG120408N-EG) was provided. Next, the base material was set at a predetermined position of an arc ion plating apparatus (manufactured by Kobe Steel, Ltd., trade name: AIP).

First Layer ($MoC_{1-x}$ Layer) Coating Step

A $MoC_{1-x}$ layer was formed on the base material by an arc ion plating method. Specifically, the following method is carried out: First, a MoC target was set in an arc-type evaporation source in the apparatus, the substrate (base material) temperature was set to 450 to 600° C., and the apparatus was evacuated. Subsequently, for example, one or both of argon gas and krypton gas was/were introduced to set the gas pressure in the apparatus to 1.0 to 3.0 Pa. Then, a negative bias voltage of 200 to 1000 V was applied to the substrate via a DC power supply to clean the surface of the base material for 40 minutes. After that, an are current of 80 to 200 A was supplied to the cathode electrode to generate a metal ion and the like from the arc-type evaporation source, whereby a $MoC_{1-x}$ layer ($0.40 \le x \le 0.60$) was formed. At this time, at the beginning of the formation of the $MoC_{1-x}$ layer (the film thickness is in the range of 0.1 $\mu m$ or less), the base material temperature and the substrate bias were set to 400 to 450° C. and –50 V, respectively, and toward the end of the formation, the temperature and the substrate bias were gradually raised to 450° C. to 550° C., and –60 to –75 V, respectively. The $MoC_{1-x}$ layer was formed to the thickness shown in the column "Thickness" of "$MoC_{1-x}$ layer" of Table 1 and Table 2 by the above method. As the apparatus used for the arc ion plating method. AIP (trade name) manufactured by Kobe Steel, Ltd was used.

Base Layer Coating Step

As for each of samples in which a base layer was formed between the base material and the $MoC_{1-x}$ layer (sample 5 and sample 6), the base layer was formed on the base material by the following procedure before carrying out the $MoC_{1-x}$ layer coating step. First, a target including the metal composition in the column of the composition of the base layer shown in Table 1 was set in the arc-type evaporation source of the arc ion plating apparatus. Next, the base material temperature was set to 600° C., and the gas pressure in the apparatus was set to 1 Pa. In the case of a nitride base layer (sample 5), a mixed gas of nitrogen gas and argon gas was introduced. In the case of a carbonitride base layer (sample 6), a mixed gas of nitrogen gas, methane gas, and argon gas was introduced as a reaction gas. After that, an are current of 150 A was supplied to the cathode electrode. By generating a metal ion and the like from the arc-type evaporation source by the supply of the are current, the base layer was formed to the thickness shown in parentheses under "Base layer" of Table 1.

Hard Coating Layer Coating Step

As for each of samples in which a hard coating layer was provided between the base material and the $MoC_{1-x}$ layer (sample 7 to sample 13, sample 16 to sample 22, sample 25, and sample 26), the hard coating layer was formed on the base material by the following procedure before carrying out the $MoC_{1-x}$ layer coating step. First, a target including the metal composition in the column of the composition of the hard coating layer shown in Table 1 and Table 2 was set in the arc-type evaporation source of the arc ion plating apparatus. Next, the base material temperature was set to 550° C. and the gas pressure in the apparatus was set to 4.0 Pa. In the case of a nitride hard coating layer, nitrogen gas was introduced as a reaction gas. In the case of a carbonitride hard coating layer, a mixed gas of nitrogen gas and methane gas was introduced as a reaction gas. In the case of an oxynitride hard coating layer, a mixed gas of oxygen gas and nitrogen gas was introduced as a reaction gas. After that, an arc current of 150 A was supplied to the cathode electrode. By generating a metal ion and the like from the arc-type evaporation source by the supply of the arc current, the hard coating layer was formed to the thickness shown in parentheses under "Hard coating layer" of Table 1 and Table 2.

When a hard coating layer having a multilayer structure was formed, a first unit layer and a second unit layer were laminated repeatedly until the target thickness was reached with the first unit layer and the second unit layer in order from the left side in Table 1 and Table 2 to form a multilayer structure. For example, in sample 11, a first unit layer formed from TiAlBN having a thickness of 5 nm and a second unit layer formed from TiSiN having a thickness of 5 nm were alternately laminated repeatedly to form a multilayer structure having a thickness of 1.0 $\mu m$.

Surface Layer Coating Step

As for samples in which a surface layer was provided on the $MoC_{1-x}$ layer (sample 5, sample 7, sample 8, sample 11, and sample 12), the surface layer was formed on the $MoC_{1-x}$ layer by the following procedure after the $MoC_{1-x}$ layer coating step. First, a target including the metal composition in the column of the composition of the surface layer shown in Table 1 was set in the arc-type evaporation source of the arc ion plating apparatus. Next, the base material temperature was set to 550° C., and the gas pressure in the apparatus was set to 4.0 Pa. In the case of a nitride surface layer, a mixed gas of nitrogen gas and argon gas was introduced as a reaction gas. After that, an arc current of 150 A was supplied to the cathode electrode. By generating a metal ion and the like from the arc-type evaporation source by the supply of the arc current, the surface layer was formed to the thickness shown in parentheses under "Surface layer" of Table 1.

Sample 1-1

As a base material, the same base material as in sample 1 was provided. A $MoC_{1-x}$ layer was formed on the base material by an are ion plating method. Specifically, the following method was carried out. First, a MoC target was set in an arc-type evaporation source of an are ion plating apparatus. Next, the base material temperature was set to 390° C., and the gas pressure in the apparatus was set to 2 Pa. Argon gas was introduced as the gas. Then, an arc current of 120 A was supplied to the cathode electrode while maintaining the substrate bias voltage at −50 V. By generating a metal ion and the like from the arc-type evaporation source by the supply of the arc current, a $MoC_{1-x}$ layer was formed to obtain a cutting tool.

Sample 1-2

As a base material, the same base material as in sample 1 was provided. A $MoC_{1-x}$ layer was formed on the base material by an arc ion plating method. Specifically, the following method was carried out. First, a MoC target was set in an arc-type evaporation source of an arc ion plating apparatus. Next, the base material temperature was set to 620° C., and the gas pressure in the apparatus was set to 0.5 Pa. Argon gas was introduced as the gas. Then, an arc current of 130 A was supplied to the cathode electrode while maintaining the substrate bias voltage at −40 V. By generating a metal ion and the like from the arc-type evaporation source by the supply of the arc current, a $MoC_{1-x}$ layer was formed to obtain a cutting tool.

Sample 1-3

As a base material, the same base material as in sample 1 was provided. A $WC_{0.56}$ layer was formed on the base material by the method disclosed in PTL 1 to obtain a cutting tool.

Sample 1-4

As a base material, the same base material as in sample 1 was provided. A TiN layer (base layer) and an AlTiN layer were formed on the base material in presented order. The TiN layer was formed by the same method as in sample 5. The AlTiN layer was formed by the same method as in the first unit layer of sample 12.

<<Evaluation of Properties of Cutting Tool>>

For the $MoC_{1-x}$ layer of each sample prepared as described above, the composition x, the crystal structure, the content of the crystal structure, the presence or absence of free carbon, and the hardness were determined. For the hardness, the hardness of the hard coating layer was measured in sample 1-3 and sample 1-4. The specific measurement methods have been described in Embodiment 1, and thus the description thereof will not be repeated. Results thereof are shown in the columns "Composition x," "Crystal structure," "Content (% by mass)," "Free carbon," and "Hardness (mgf/μm²)" of "$MoC_{1-x}$ layer" of Table 1 and Table 2. In Table 1 and Table 2, the notation "Absent" in the column "Free carbon" shows that the $MoC_{1-x}$ layer does not include free carbon, and the notation "Present" shows that the $MoC_{1-x}$ layer includes free carbon. In sample 1 to sample 26, sample 1-1, and sample 1-2, it was confirmed that the $MoC_{1-x}$ layer consisted of 100% by mass of a hexagonal crystal structure.

The thickness of each of the $MoC_{1-x}$ layer, the base layer, the hard coating layer (first unit layer and second unit layer), and the coating was measured. The specific measurement method has been described in Embodiment 1, and thus the description thereof will not be repeated. Results thereof are shown in Table 1 and Table 2. In Table 1 and Table 2, the notation "−" in "Base layer" and "Hard coating layer" shows that the corresponding layer is not present in the coating. As for the notations in "Hard coating layer", "TiAlBN (5 nm)/TiSiN (5 nm) multilayer structure (1.0 μm)", for example, shows that the hard coating layer is formed as a multilayer structure (total thickness of 1.0 μm) in which a TiAlBN layer (first unit layer) having a thickness of 5 nm and a TiSiN layer (second unit layer) having a thickness of 5 nm are alternately laminated.

TABLE 1

| | | | $MoC_{1-x}$ layer | | | | | | | | Breakage | Wear |
|---|---|---|---|---|---|---|---|---|---|---|---|---|
| Sample No. | Base layer (thickness) | Hard coating layer (thickness) | Composition x | Crystal structure | Content (% by mass) | Free carbon | Hardness (mgf/μm²) | Thickness (μm) | Surface layer (thickness) | Coating thickness (μm) | resistance test (min) | resistance test (min) |
| 1 | — | — | 0.44 | Hexagonal | 100 | Absent | 2,950 | 2.0 | — | 2.0 | 56 | 30 |
| 2 | — | — | 0.50 | Hexagonal | 100 | Absent | 3,200 | 2.0 | — | 2.0 | 65 | 40 |
| 3 | — | — | 0.55 | Hexagonal | 100 | Absent | 3,100 | 2.0 | — | 2.0 | 70 | 39 |
| 4 | — | — | 0.50 | Hexagonal | 100 | Absent | 2,800 | 0.5 | — | 0.5 | 40 | 21 |
| 5 | TiN (0.5 μm) | — | 0.50 | Hexagonal | 100 | Absent | 3,400 | 3.5 | TiN (0.5 μm) | 4.5 | 95 | 49 |
| 6 | TiWCN (5 μm) | — | 0.50 | Hexagonal | 100 | Absent | 3,800 | 6.5 | — | 11.5 | 87 | 68 |
| 7 | — | TiAlSiCN (1 μm) | 0.53 | Hexagonal | 100 | Absent | 3,250 | 2.0 | TiCN (0.5 μm) | 3.5 | 108 | 52 |
| 8 | — | ZrN (1 μm) | 0.55 | Hexagonal | 100 | Absent | 3,100 | 2.0 | ZrB₂ (0.5 μm) | 3.5 | 105 | 44 |
| 9 | — | AlCrBN (1 μm) | 0.52 | Hexagonal | 100 | Absent | 3,150 | 2.5 | — | 3.5 | 107 | 45 |
| 10 | — | TiAlSiON (1 μm) | 0.51 | Hexagonal | 100 | Absent | 3,300 | 2.5 | — | 3.5 | 110 | 55 |
| 11 | — | TiAlBN (5 nm)/TiSiN (5 nm) multiplayer structure (1.0 μm) | 0.54 | Hexagonal | 100 | Absent | 3,600 | 2.0 | TiSiN (0.5 μm) | 3.5 | 125 | 65 |
| 12 | — | TiAlN (10 nm)/AlCrN (10 nm) multiplayer structure (2.0 μm) | 0.54 | Hexagonal | 100 | Absent | 3,350 | 1.5 | ArCrN (0.5 μm) | 4.0 | 118 | 61 |
| 13 | — | TiAlSiN (60 nm)/AlCrBN (60 nm) multiplayer structure (1.5 μm) | 0.54 | Hexagonal | 100 | Absent | 3,550 | 2.0 | — | 3.5 | 120 | 63 |
| 14 | — | — | 0.40 | Hexagonal | 100 | Absent | 2,900 | 2.0 | — | 2.0 | 55 | 28 |
| 15 | — | — | 0.60 | Hexagonal | 100 | Absent | 3,080 | 2.0 | — | 2.0 | 69 | 38 |

TABLE 1-continued

| Sample No. | Base layer (thickness) | Hard coating layer (thickness) | MoC$_{1-x}$ layer | | | | | | | Coating thickness (μm) | Breakage resistance test (min) | Wear resistance test (min) |
| | | | Composition x | Crystal structure | Content (% by mass) | Free carbon | Hardness (mgf/ μm$^2$) | Thickness (μm) | Surface layer (thickness) | | | |
|---|---|---|---|---|---|---|---|---|---|---|---|---|
| 16 | — | TiAlSiN (0.05 μm) | 0.44 | Hexagonal | 100 | Absent | 2,950 | 2.0 | — | 2.05 | 60 | 32 |
| 17 | — | TiAlSiN (0.1 μm) | 0.44 | Hexagonal | 100 | Absent | 2,950 | 2.0 | — | 2.1 | 66 | 38 |
| 18 | — | TiAlSiN (10.0 μm) | 0.44 | Hexagonal | 100 | Absent | 2,950 | 2.0 | — | 12.0 | 95 | 70 |
| 19 | — | TiAlSiN (15.0 μm) | 0.44 | Hexagonal | 100 | Absent | 2,950 | 2.0 | — | 17.0 | 83 | 45 |

TABLE 2

| Sample No. | Base layer (thickness) | Hard coating layer (thickness) | MoC$_{1-x}$ layer | | | | | | | Coating thickness (μm) | Breakage resistance test (min) | Wear resistance test (min) |
| | | | Composition x | Crystal structure | Content (% by mass) | Free carbon | Hardness (mgf/ μm$^2$) | Thickness (μm) | Surface layer (thickness) | | | |
|---|---|---|---|---|---|---|---|---|---|---|---|---|
| 20 | — | TiAlBN (1 nm)/TiSiN (1 nm) multiplayer structure (1.0 μm) | 0.54 | Hexagonal | 100 | Absent | 3,600 | 2.0 | — | 3.0 | 83 | 80 |
| 21 | — | TiAlBN (100 nm)/TiSiN (100 nm) multiplayer structure (10 μm) | 0.54 | Hexagonal | 100 | Absent | 3,600 | 2.0 | — | 12.0 | 92 | 65 |
| 22 | — | TiAlBN (150 nm)/TiSiN (150 nm) multiplayer structure (15 μm) | 0.54 | Hexagonal | 100 | Absent | 3,600 | 2.0 | — | 17.0 | 85 | 45 |
| 23 | — | — | 0.55 | Hexagonal | 100 | Absent | 2,730 | 0.1 | — | 0.1 | 35 | 20 |
| 24 | — | — | 0.55 | Hexagonal | 100 | Absent | 3,650 | 7.0 | — | 7.0 | 130 | 72 |
| 25 | — | TiAlBN (1 nm)/TiSiN (1 nm) multiplayer structure (1.0 μm) | 0.55 | Hexagonal | 100 | Absent | 3,650 | 0.1 | — | 0.2 | 39 | 29 |
| 26 | — | TiAlBN (100 nm)/TiSiN (100 nm) multiplayer structure (10 μm) | 0.55 | Hexagonal | 100 | Absent | 3,650 | 10.0 | — | 20.0 | 98 | 69 |
| 1-1 | — | — | 0.39 | Hexagonal | 100 | Absen | 2,800 | 2.0 | — | 2.0 | 20 | 6 |
| 1-2 | — | — | 0.61 | Hexagonal | 100 | Present | 2,900 | 2.0 | — | 2.0 | 18 | 5 |
| 1-3 | — | WC0.56 (2.0 μm), hexagonal Hardness: 3,650 (mgf/μm$^2$) | — | — | — | — | — | — | — | 2.0 | 25 | 14 |
| 1-4 | TiN (0.5 μm) | AlTiN (1.5 μm), cubic Hardness: 3,900 (mgf/μm$^2$) | — | — | — | — | — | — | — | 2.0 | 10 | 3 |

<<Cutting Test 1>>

By using the cutting tool of each sample prepared as described above, the cutting time until breakage of the cutting tool was measured under the following cutting conditions to evaluate the breakage resistance of the cutting tool. The following cutting conditions correspond to high-load, high-speed, and high-efficiency working. Results thereof are shown in Table 1 and Table 2. A longer cutting time shows better breakage resistance.

Cutting Conditions for Breakage Resistance Test (Face Milling Working Test)

Insert: SEET13T3AGSN-L

Work material (substance): Ti-6Al-4V

Speed: 70 m/min

Feed: 0.1 mm/cutting edge

Cut: depth of cut: 5 mm, radial depth of cut: 10 mm

Cutting Test 2

By using the cutting tool of each sample prepared as described above, a cutting fest was carried out under the following cutting conditions to evaluate the wear resistance of the cutting tool. The following cutting conditions correspond to high-load, high-speed, and high-efficiency working. Results thereof are shown in Table 1 and Table 2. A longer cutting time shows better wear resistance.

Cutting Conditions for Wear Resistance Test (Outer Diameter Turning Test)

Insert: CNMG120408N-EG

Work material (substance): Ti—6Al—4V

Speed: 140 m/min

Feed. 0.15 mm/cutting edge

Cut: depth of cut: 0.8 mm

Life criterion: Time until flank face wear exceeds 0.2 mm

From the results of the cutting tests, it was confirmed that even in high-load, high-speed, and high-efficiency working, the cutting tools of sample 1 to sample 26, which correspond to Examples, have better breakage resistance and wear resistance and have a longer tool life than the cutting tools of sample 1-1 to sample 1-4, which correspond to Comparative Examples. This suggested that the cutting tools of sample 1 to sample 26, which correspond to Examples, were suitable for a use of high-load, high-speed, and high-efficiency working, particularly a use requiring breakage resistance and wear resistance.

Example 2

Preparation of Cutting Tool
Sample 1A to Sample 25A
Base Material Provision Step As a base material, JIS standard K10 cemented carbide (shape: JIS standard SEET13T3AGSN-L and CNMG120408N-EG) was provided. Next, the base material was set at a predetermined position of an are ion plating apparatus (manufactured by Kobe Sicel, Ltd., trade name: ATP).
First layer ($TaC_{1-y}$ Layer) Coating Step A $TaC_{1-y}$ layer was formed on the base material by an arc ion plating method. Specifically, the following method was carried out. First, a TaC target was set in an arc-type evaporation source in the apparatus, the substrate (base material) temperature was set to 450 to 600° C., and the apparatus was evacuated. Subsequently, for example, one or both of argon gas and krypton gas was/were introduced to set the gas pressure in the apparatus to 1.0 to 3.0 Pa. Then, a negative bias voltage of 200 to 1000 V was applied to the substrate via a DC power supply to clean the surface of the base material for 40 minutes. After that, an arc current of 80 to 200 A is supplied to the cathode electrode to generate a metal ion and the like from the arc-type evaporation source, whereby a $TaC_{1-y}$ layer ($0.40 \leq y \leq 0.60$) including 95% by mass or more of a hexagonal crystal structure was formed. At this time, at the beginning of the formation of the $TaC_{1-y}$ layer (the film thickness is in the range of 0.1 μm or less), the base material temperature and the substrate bias were set to 400 to 450° C. and –50 V, respectively, and toward the end of the formation, the temperature and the substrate bias were gradually raised to 450° C. to 550° C., and –60 to –75 V, respectively. The $TaC_{1-y}$ layer was formed to the thickness shown in the column "Thickness" of "$TaC_{1-y}$ layer" of Table 3 and Table 4 by the above method. As the apparatus used for the arc ion plating method, AIP (trade name) manufactured by Kobe Steel, Ltd, was used.
Base Layer Coating Step As for each of samples in which a base layer was formed between the base material and the $TaC_{1-y}$ layer (sample 5A and sample 6A), the base layer was formed on the base material by the following procedure before carrying out the $TaC_{1-y}$ layer coating step. First, a target including the metal composition in the column of the composition of the base layer shown in Table 3 was set in an arc-type evaporation source of the are ion plating apparatus. Next, the base material temperature was set to 600° C., and the gas pressure in the apparatus was set to 1 Pa. In the case of a nitride base layer (sample 5A), a mixed gas of nitrogen gas and argon gas was introduced. In the case of a carbonitride base layer (sample 6A), a mixed gas of nitrogen gas, methane gas, and argon gas was introduced as a reaction gas. After that, an arc current of 150 A was supplied to the cathode electrode. By generating a metal ion and the like from the arc-type evaporation source by the supply of the are current, the base layer was formed to the thickness shown in parentheses under "Base layer" of Table 3.
Hard Coating Layer Coating Step As for each of samples in which a hard coating layer was provided between the base material and the $TaC_{1-y}$ layer (sample 7A to sample 13A and sample 17A to sample 25A), the hard coating layer was formed on the base material by the following procedure before carrying out the $TaC_{1-y}$ layer coating step. First, a target including the metal composition in the column of the composition of the hard coating layer shown in Table 3 and Table 4 was set in the arc-type evaporation source of the arc ion plating apparatus. Next, the base material temperature was set to 550° C., and the gas pressure in the apparatus was set to 4.0 Pa. In the case of a nitride hard coating layer, a mixed gas of nitrogen gas and argon gas was introduced as a reaction gas. In the case of a carbonitride hard coating layer, a mixed gas of nitrogen gas and methane gas was introduced as a reaction gas. In the case of an oxynitride hard coating layer, a mixed gas of oxygen gas and nitrogen gas was introduced as a reaction gas. After that, an arc current of 150 A was supplied to the cathode electrode. By generating a metal ion and the like from the arc-type evaporation source by the supply of the arc current, the hard coating layer was formed to the thickness shown in parentheses under "Hard coating layer" of Table 3 and Table 4.

When a hard coating layer having a multilayer structure was formed, a first unit layer and a second unit layer were laminated repeatedly until the target thickness was reached with the first unit layer and the second unit layer in order from the left side in Table 3 and Table 4 to form a multilayer structure. For example, in sample 11A, a first unit layer formed from TiAlBN having a thickness of 6 nm and a second unit layer formed from TiSIN having a thickness of 6 nm were alternately laminated repeatedly to form a multilayer structure having a thickness of 1.0 μm.
Surface Layer Coating Step As for samples in which a surface layer was provided on the $TaC_{1-y}$ layer (sample 5A, sample 7A, sample 8A, sample 11A, and sample 12A), the surface layer was formed on the $TaC_{1-y}$ layer by the following procedure after the $TaC_{1-y}$ layer coating step. First, a target including the metal composition in the column of the composition of the surface layer shown in Table 3 was set in the arc-type evaporation source of the are ion plating apparatus. Next, the base material temperature was set to 550° C., and the gas pressure in the apparatus was set to 4.0 Pa. In the case of a nitride surface layer, a mixed gas of nitrogen gas and argon gas was introduced as a reaction gas. After that, an are current of 150 A was supplied to the cathode electrode. By generating a metal ion and the like from the arc-type evaporation source by the supply of the arc current, the surface layer was formed to the thickness shown in parentheses under "Surface layer" of Table 3.
Sample 1-1A As a base material, the same base material as in sample 1A was provided. On the base material, a $TaC_{1-y}$ layer was formed on the base material by an are ion plating method. Specifically, the following method was carried out. First, a TaC target was set in an arc-type evaporation source of an are ion plating apparatus. Next, the base material temperature was set to 380° C., and the gas pressure in the apparatus was set to 1.5 Pa. Argon gas was introduced as the gas. Then, an are current of 120 A was supplied to the cathode electrode while maintaining the substrate bias voltage at –55 V. By generating a metal ion and the like from the arc-type evaporation source by the supply of the are current, a $TaC_{1-y}$ layer was formed to obtain a cutting tool.

Sample 1-2A

As a base material, the same base material as in sample 1A was provided. On the base material, a $TaC_{1-y}$ layer was formed on the base material by an arc ion plating method. Specifically, the following method was carried out. First, a TaC target was set in an arc-type evaporation source of an arc ion plating apparatus. Next, the base material temperature was set to 610° C. and the gas pressure in the apparatus was set to 0.8 Pa. Argon gas was introduced as the gas. Then, an arc current of 120 A was supplied to the cathode electrode while maintaining the substrate bias voltage at –43 V. By generating a metal ion and the like from the arc-type evaporation source by the supply of the are current, a $TaC_{1-y}$ layer was formed to obtain a cutting tool.

Sample 1-3A

As a base material, the same base material as in sample 1A was provided A $WC_{0.56}$ layer was formed on the base material by the method disclosed in PTL 1 to obtain a cutting tool.

[Sample 1-4A]

As a base material, the same base material as in sample 1A was provided. A TiN layer (base layer) and an AlTIN layer were formed on the base material in presented order. The TIN layer was formed by the same method as in sample 5A. The AlTiN layer was formed by the same method as in the first unit layer of sample 12A.

Sample 1-5A

As a base material, the same base material as in sample 1 was provided. A $TaC_{1-y}$ layer was formed on the base material by an arc ion plating method. Specifically, the following method was carried out. First, a TaC target was set in an arc-type evaporation source of an are ion plating apparatus. Next, the base material temperature was set to 420° C., and the gas pressure in the apparatus was set to 1 Pa. Argon gas was introduced as the gas. Then, an arc current of 120 A was supplied to the cathode electrode while maintaining the substrate bias voltage at –69 V By generating a metal ion and the like from the arc-type evaporation source by the supply of the arc current, a $TaC_{1-y}$ layer was formed to obtain a cutting tool.

<<Evaluation of Properties of Cutting Tool>>

For the $TaC_{1-y}$ layer of each sample prepared as described above, the composition y, the crystal structure, the content of the hexagonal $TaC_{1-y}$, the presence or absence of free carbon, and the hardness were determined. The specific measurement methods have been described in Embodiment 1, and thus the description thereof will not be repeated. Results thereof are shown in the columns "Composition y," "Crystal structure," "Hexagonal content (% by mass)," "Free carbon," and "Hardness (mgf/μm²)" of "$TaC_{1-y}$ layer" of Table 3 and Table 4. The notation "Hexagonal+cubic" in the column "Crystal structure" of Table 3 and Table 4 shows that hexagonal $TaC_{1-y}$ and cubic $TaC_{1-y}$ were mixed in the $TaC_{1-y}$ layer. For example, in sample 16A, the notation shows that 95% by mass of hexagonal $TaC_{1-y}$ is present and the balance (5% by mass) is cubic $TaC_{1-y}$. In Table 3 and Table 4, the notation "Absent" in the column "Free carbon" shows that the $TaC_{1-y}$ layer does not include free carbon, and the notation "Present" shows that the $TaC_{1-y}$ layer includes free carbon.

The thickness of each of the $TaC_{1-y}$ layer, the base layer, the hard coating layer (first unit layer and second unit layer), and the coating was measured. The specific measurement method has been described in Embodiment 1, and thus the description thereof will not be repeated. Results thereof are shown in Table 3 and Table 4. In Table 3 and Table 4, the notation "–" in "Base layer" and "Hard coating layer" shows that the corresponding layer is not present in the coating. As for the notations in "Hard coating layer", "TiAlBN (6 nm)/TiSiN (6 nm) multilayer structure (1.0 μm)", for example, shows that the hard coating layer is formed as a multilayer structure (total thickness of 1.0 μm) in which a TiAlBN layer (first unit layer) having a thickness of 6 om and a TiSiN layer (second unit layer) having a thickness of 6 nm are alternately laminated.

TABLE 3

| Sample No. | Base layer (thickness) | Hard coating layer (thickness) | TaC₁₋ᵧ layer | | | | | | | Coating thickness (μm) | Breakage resistance test (min) | Wear resistance test (min) |
|---|---|---|---|---|---|---|---|---|---|---|---|---|
| | | | Composition y | Crystal structure | Hexagonal content (% by mass) | Free carbon | Hardness (mgf/μm²) | Thickness (μm) | Surface layer (thickness) | | | |
| 1A | — | — | 0.45 | Hexagonal | 100 | Absent | 3,100 | 2.0 | — | 2.0 | 51 | 38 |
| 2A | — | — | 0.51 | Hexagonal | 100 | Absent | 3,350 | 2.0 | — | 2.0 | 60 | 48 |
| 3A | — | — | 0.55 | Hexagonal | 100 | Absent | 3,250 | 2.0 | — | 2.0 | 65 | 47 |
| 4A | — | — | 0.51 | Hexagonal | 100 | Absent | 2,790 | 0.5 | — | 0.5 | 35 | 29 |
| 5A | TiN (0.5 μm) | — | 0.51 | Hexagonal | 100 | Absent | 3,550 | 3.0 | TiN (0.5 μm) | 4.0 | 90 | 57 |
| 6A | TiWCN (5 μm) | — | 0.51 | Hexagonal | 100 | Absent | 3,950 | 2.0 | — | 7.0 | 71 | 93 |
| 7A | — | TiAlBCN (1 μm) | 0.55 | Hexagonal | 100 | Absent | 3,400 | 2.0 | TiCN (0.5 μm) | 3.5 | 103 | 60 |
| 8A | — | ZrN (0.5 μm) | 0.51 | Hexagonal | 100 | Absent | 3,250 | 2.5 | ZrB₂ (0.5 μm) | 3.5 | 100 | 52 |
| 9A | — | CrSiBN (1 μm) | 0.51 | Hexagonal | 100 | Absent | 3,300 | 2.5 | — | 3.5 | 102 | 53 |
| 10A | — | AlCrBON (1 μm) | 0.51 | Hexagonal | 100 | Absent | 3,450 | 2.5 | — | 3.5 | 105 | 63 |
| 11A | — | TiAlBN (6 nm)/TiSiN (6 nm) multiplayer structure (1.0 μm) | 0.54 | Hexagonal | 100 | Absent | 4,000 | 2.0 | TiSiN (0.5 μm) | 3.5 | 120 | 73 |
| 12A | — | TiAlN (8 nm)/AlCrN (12 nm) multiplayer structure (2.0 μm) | 0.54 | Hexagonal | 100 | Absent | 3,500 | 1.0 | AlCrN (0.5 μm) | 3.5 | 113 | 69 |

TABLE 3-continued

| Sample No. | Base layer (thickness) | Hard coating layer (thickness) | TaC$_{1-y}$ layer | | | | | | | Coating thickness (μm) | Breakage resistance test (min) | Wear resistance test (min) |
|---|---|---|---|---|---|---|---|---|---|---|---|---|
| | | | Composition y | Crystal structure | Hexagonal content (% by mass) | Free carbon | Hardness (mgf/μm²) | Thickness (μm) | Surface layer (thickness) | | | |
| 13A | — | TiAlSiN (60 nm)/AlCrBN (60 nm) multiplayer structure (1.5 μm) | 0.54 | Hexagonal | 100 | Absent | 3,900 | 2.0 | — | 3.5 | 115 | 71 |
| 14A | — | — | 0.40 | Hexagonal | 100 | Absent | 3,050 | 0.1 | — | 0.1 | 45 | 35 |
| 15A | — | — | 0.60 | Hexagonal | 100 | Absent | 3,150 | 10.0 | — | 10.0 | 57 | 45 |
| 16A | — | — | 0.52 | Hexagonal + cubic | 95 | Absent | 3,250 | 2.0 | — | 2.0 | 43 | 32 |
| 17A | — | TiAlBN (0.05 μm) | 0.45 | Hexagonal | 100 | Absent | 3,100 | 2.0 | — | 2.05 | 53 | 40 |
| 18A | — | TiAlBN (0.1 μm) | 0.45 | Hexagonal | 100 | Absent | 3,100 | 2.0 | — | 2.1 | 91 | 73 |

TABLE 4

| Sample No. | Base layer (thickness) | Hard coating layer (thickness) | TaC$_{1-y}$ layer | | | | | | | Coating thickness (μm) | Breakage resistance test (min) | Wear resistance test (min) |
|---|---|---|---|---|---|---|---|---|---|---|---|---|
| | | | Composition y | Crystal structure | Hexagonal content (% by mass) | Free carbon | Hardness (mgf/μm²) | Thickness (μm) | Surface layer (thickness) | | | |
| 19A | — | TiAlBN (10.0 μm) | 0.45 | Hexagonal | 100 | Absent | 3,100 | 2.0 | — | 12.0 | 103 | 77 |
| 20A | — | TiAlBN (15.0 μm) | 0.45 | Hexagonal | 100 | Absent | 3,100 | 2.0 | — | 17.0 | 56 | 66 |
| 21A | — | TiAlBN (1 nm)/TiSiN (1 nm) multiplayer structure (1.0 μm) | 0.54 | Hexagonal | 100 | Absent | 4,000 | 2.0 | — | 3.0 | 70 | 92 |
| 22A | — | TiAlBN (100 nm)/TiSiN (100 nm) multiplayer structure (10 μm) | 0.54 | Hexagonal | 100 | Absent | 4,000 | 2.0 | — | 12.0 | 85 | 88 |
| 23A | — | TiAlBN (160 nm)/TiSiN (160 nm) multiplayer structure (15 μm) | 0.54 | Hexagonal | 100 | Absent | 4,000 | 2.0 | — | 17.0 | 49 | 58 |
| 24A | — | TiAlBN (1 nm)/TiSiN (1 nm) multiplayer structure (0.1 μm) | 0.54 | Hexagonal | 100 | Absent | 4,000 | 0.1 | — | 0.2 | 49 | 39 |
| 25A | — | TiAlBN (100 nm)/TiSiN (100 nm) multiplayer structure (10 μm) | 0.54 | Hexagonal | 100 | Absent | 4,000 | 10 | — | 20 | 78 | 94 |
| 1-1A | — | — | 0.39 | Hexagonal | 100 | Absent | 2,950 | 2.0 | — | 2.0 | 18 | 10 |
| 1-2A | — | — | 0.61 | Hexagonal | 100 | Present | 3,050 | 2.0 | — | 2.0 | 16 | 8 |
| 1-3A | — | WC0.56 (2.0 μm), hexagonal Hardness: 3,850 (mgf/μm²) | — | — | — | — | — | — | — | 2.0 | 25 | 14 |
| 1-4A | TiN (0.5 μm) | AlTiN (1.5 μm), cubic Hardness: 3,900 (mgf/μm²) | — | — | — | — | — | — | — | 2.0 | 4 | 3 |
| 1-5A | — | — | 0.40 | Hexagonal + Cubic | 94 | Absent | 3,020 | 2.0 | — | 2.0 | 10 | 2 |

Cutting Test 1

By using the cutting tool of each sample prepared as described above, the cutting time until breakage of the cutting tool was measured under the same cutting conditions as in cutting test 1 of Example 1 to evaluate the breakage resistance of the cutting tool. The cutting conditions correspond to high-speed and high-efficiency working. Results thereof are shown in Table 3 and Table 4. A longer cutting time shows better breakage resistance.

Cutting Test 2

By using the cutting tool of each sample prepared as described above, a cutting test was carried out under the same cutting conditions as in cutting test 2 of Example 1 to evaluate the wear resistance of the cutting tool. The cutting conditions correspond to high-speed and high-efficiency working. Results thereof are shown in Table 3 and Table 4. A longer cutting time shows better wear resistance.

From the results of the cutting tests, it was confirmed that even in high-speed and high-efficiency working, the cutting tools of sample 1A to sample 25A, which correspond to Examples, have better breakage resistance and wear resistance and have a longer tool life than the cutting tools of sample 1-1A to sample 1-5A, which correspond to Comparative Examples. This suggested that the cutting tools of sample 1A to sample 25A, which correspond to Examples, are suitable for a use of high-load, high-speed, and high-efficiency working, particularly a use requiring breakage resistance and wear resistance.

The embodiments and Examples of the present invention have been described as above, and it is also intended, from the beginning, to appropriately combine the configurations of the embodiments and the Examples described above.

The embodiments and Examples disclosed this time should be considered to be illustrative in all respects and to be non-limiting. The scope of the present invention is defined by Claims, not by the above embodiments and Examples, and is intended to include all modifications within the meaning and scope equivalent to Claims.

REFERENCE SIGNS LIST

1 Rake face, 2 Flank face, 3 Cutting edge ridgeline portion, 4 Coating, 10 Cutting tool, 11 Base material, 12 First layer, 13 Hard coating layer, 131 First unit layer, 132 Second unit layer

The invention claimed is:

1. A cutting tool comprising a base material and a coating disposed on the base material, wherein
the coating comprises a first layer, the first layer being an outermost layer of the cutting tool,
the first layer consists of a $MoC_{1-x}$ layer formed from a compound represented by $MoC_{1-x}$ or a $TaC_{1-y}$ layer formed from a compound represented by $TaC_{1-y}$,
the compound represented by $MoC_{1-x}$ consists of a hexagonal crystal structure,
the x is 0.40 or more and 0.60 or less,
the compound represented by $TaC_{1-y}$ comprises 95% by mass or more of a hexagonal crystal structure, and
the y is 0.40 or more and 0.60 or less.

2. The cutting tool according to claim 1, wherein the first layer does not include free carbon.

3. The cutting tool according to claim 1, wherein a film hardness of the first layer is 2700 $mgf/\mu m^2$ or more and 4200 $mgf/\mu m^2$ or less.

4. The cutting tool according to claim 1, wherein the first layer is in contact with the base material.

5. The cutting tool according to claim 1, wherein
the coating further comprises a hard coating layer disposed between the base material and the first layer,
the hard coating layer comprises a first unit layer,
a composition of the first unit layer is different from a composition of the first layer, and
the first unit layer is formed from at least one element selected from the group consisting of a periodic table group 4 element, a periodic table group 5 element, a periodic table group 6 element, aluminum, and silicon, or formed from a compound consisting of at least one element selected from the group consisting of a periodic table group 4 element, a periodic table group 5 element, a periodic table group 6 element, aluminum, and silicon, and at least one element selected from the group consisting of carbon, nitrogen, oxygen, and boron.

6. The cutting tool according to claim 5, wherein
the hard coating layer consists of the first unit layer, and
a thickness of the first unit layer is 0.1 μm or more and 15 μm or less.

7. The cutting tool according to claim 5, wherein
the hard coating layer further comprises a second unit layer,
a composition of the second unit layer is different from the composition of the first layer and the composition of the first unit layer,
the second unit layer is formed from at least one element selected from the group consisting of a periodic table group 4 element, a periodic table group 5 element, a periodic table group 6 element, aluminum, and silicon, or formed from a compound consisting of at least one element selected from the group consisting of a periodic table group 4 element, a periodic table group 5 element, a periodic table group 6 element, aluminum, and silicon, and at least one element selected from the group consisting of carbon, nitrogen, oxygen, and boron, and
the first unit layer and the second unit layer form a multilayer structure in which both the unit layers are alternately laminated, with one or more layers each.

8. The cutting tool according to claim 7, wherein
a thickness of the first unit layer is 1 nm or more and 100 nm or less, and
a thickness of the second unit layer is 1 nm or more and 100 nm or less.

9. The cutting tool according to claim 7, wherein
a thickness of the first layer is 0.1 μm or more and 10 μm or less, and
a thickness of the hard coating layer is 0.1 μm or more and 10 μm or less.

10. The cutting tool according to claim 9, wherein a thickness of the coating is 0.2 μm or more and 20 μm or less.

11. The cutting tool according to claim 1, wherein
the base material comprises at least one selected from the group consisting of a cemented carbide, a cermet, high-speed steel, a ceramic, a cubic boron nitride sintered material, and a diamond sintered material.

12. The cutting tool according to claim 1, wherein
the first layer consists of the $MoC_{1-x}$ layer formed from the compound represented by $MoC_{1-x}$,
the coating:
consists of the first layer; or
comprises the first layer, and at least one of a base layer and a hard coating layer disposed between the base material and the first layer.

13. The cutting tool according to claim 12, wherein
the hard coating layer comprises a first unit layer,
a composition of the first unit layer is different from the composition of the first layer, and
the first unit layer is formed from at least one element selected from the group consisting of a periodic table group 4 element, a periodic table group 5 element, a periodic table group 6 element, aluminum, and silicon, or formed from a compound consisting of at least one element selected from the group consisting of a periodic table group 4 element, a periodic table group 5 element, a periodic table group 6 element, aluminum, and silicon, and at least one selected from the group consisting of carbon, nitrogen, oxygen, and boron.

14. The cutting tool according to claim 12, wherein
the base layer comprises at least one selected from the group consisting of a TiN layer, a TiCN layer, a $ZrB_2$ layer, a TiSiN layer and an AlCrN layer.

15. The cutting tool according to claim 1, wherein
the first layer consists of the $TaC_{1-y}$ layer formed from the compound represented by $TaC_{1-y}$.

the coating comprises the first layer, and a hard coating layer disposed between the base material and the first layer, the hard coating layer comprises a first unit layer, a composition of the first unit layer is different from the composition of the first layer, and the first unit layer is formed from at least one element selected from the group consisting of a periodic table group 4 element, a periodic table group 5 element, a periodic table group 6 element, aluminum, and silicon, or formed from a compound consisting of at least one element selected from the group consisting of a periodic table group 4 element, a periodic table group 5 element, a periodic table group 6 element, aluminum, and silicon, and at least one element selected from the group consisting of carbon, nitrogen, oxygen, and boron.

16. The cutting tool according to claim 1, wherein the x is not 0.50.

17. A cutting tool comprising a base material and a coating disposed on the base material, wherein:

the coating comprises a first layer, the first layer consists of a $TaC_{1-y}$ layer formed from a compound represented by $TaC_{1-y}$, the compound represented by $TaC_{1-y}$ comprises 95% by mass or more of a hexagonal crystal structure, and the y is 0.40 or more and 0.60 or less.

\* \* \* \* \*